US012665558B2

(12) United States Patent
Cheng

(10) Patent No.: US 12,665,558 B2
(45) Date of Patent: Jun. 23, 2026

(54) OPERATIONAL AMPLIFIER CIRCUIT AND SWITCHING CIRCUIT USING THE SAME

(71) Applicant: Joulwatt Technology Co., Ltd., Hangzhou (CN)

(72) Inventor: Yang Cheng, Hangzhou (CN)

(73) Assignee: Joulwatt Technology Co., Ltd., Hangzhou (CN)

( * ) Notice: Subject to any disclaimer, the term of this patent is extended or adjusted under 35 U.S.C. 154(b) by 407 days.

(21) Appl. No.: 18/395,679

(22) Filed: Dec. 25, 2023

(65) Prior Publication Data

US 2024/0213939 A1 Jun. 27, 2024

(30) Foreign Application Priority Data

Dec. 26, 2022 (CN) ......................... 202211676793.X

(51) Int. Cl.
*H03F 3/45* (2006.01)
(52) U.S. Cl.
CPC ................................ *H03F 3/45475* (2013.01)
(58) Field of Classification Search
CPC ........................................................ H03F 3/45
USPC ........................................................ 330/252
See application file for complete search history.

(56) References Cited

U.S. PATENT DOCUMENTS

| | | |
|---|---|---|
| 7,583,128 B1 | 9/2009 | Batarseh |
| 2005/0231179 A1 | 10/2005 | Ishizaki |
| 2017/0264190 A1 | 9/2017 | Unno et al. |

FOREIGN PATENT DOCUMENTS

| | | |
|---|---|---|
| CN | 101727120 A | 6/2010 |
| CN | 111446932 A | 7/2020 |
| CN | 211151798 U | 7/2020 |
| CN | 112910424 A | 6/2021 |

OTHER PUBLICATIONS

Zhou, Ze-Kun; Wang, Anqi; Wang, Yunkun; Wang, Jiani; Shi, Yue; Wang, Zhuo; Zhang, Bo, "An Error Amplifier With a Low Power Multi-Mode Voltage Clamper for Transient Enhancement and High Reliability," IEEE Transactions on Circuits and Systems I: Regular Papers, vol. 67, Issue 11, pp. 4075-4084 (2020). DOI: 10.1109/tcsi.2020.3010346.

*Primary Examiner* — Henry Choe
(74) *Attorney, Agent, or Firm* — IPro, PLLC

(57) ABSTRACT

Disclosed is an operational amplifier circuit and a switching circuit. The operational amplifier circuit comprises a main operational amplifier, which performs operational amplification based on a reference signal and a feedback signal of an output voltage of the switching circuit to obtain an operational amplification signal for controlling a switching state of the switching circuit, and generates an adjustment signal according to the feedback signal, the reference signal, and a preset first voltage. When a load of the switching circuit is reduced, an output terminal of the main operational amplifier receives the adjustment signal and obtains an adjusted operational amplification signal, and the adjustment signal is used for suppressing a change of the operational amplification signal. The operational amplification signal can be self-adaptively adjusted when the load is reduced, without detecting load change, thus the operational amplification signal can be quickly restored, the switching circuit has better output characteristics.

18 Claims, 5 Drawing Sheets

- prior art -

OPERATIONAL AMPLIFIER CIRCUIT AND SWITCHING CIRCUIT USING THE SAME

CROSS-REFERENCE TO RELATED APPLICATION

This application claims priority to Chinese patent application No. 202211676793.X, filed on Dec. 26, 2022, published as CN116366042A on Jun. 30, 2023, and entitled "OPERATIONAL AMPLIFIER CIRCUIT AND SWITCHING CIRCUIT USING THE SAME", the entire content of which is incorporated by reference in its entirety.

FIELD OF THE DISCLOSURE

The present disclosure relates to a technical field of power electronics, in particular to an operational amplifier circuit and a switching circuit using the same.

DESCRIPTION OF THE RELATED ART

In a switching circuit, it is usually necessary to use an operational amplifier to perform operational amplification based on a reference voltage and a feedback voltage of an output voltage of the switching circuit, to obtain an adjustment signal for controlling a switching state; as shown in FIG. 1, when an output of the switching circuit is unloaded or changed from heavy-load status to light-load status, because current on an inductor cannot rapidly decrease, output voltage overshoot may occur at the output terminal of the switching circuit, which makes the operational amplifier output an excessively low value. After the overshoot is over, it is relatively difficult for the output of the operational amplifier to restore to a new corresponding target value in a short time, especially when the load is switched frequently, which will affect dynamic response when a next loading comes shortly.

SUMMARY OF THE DISCLOSURE

An objective of the present disclosure is to provide an operational amplifier circuit and a switching circuit using the operational amplifier circuit, so as to make the switching circuit have good output performance, thus a problem of the prior art that an output signal of the operational amplifier cannot be quickly restored when the load is reduced, which may affect the output performance of the switching circuit, can be solved.

In order to realize the above objective, the present disclosure provides an operational amplifier circuit, comprising a main operational amplifier using in a switching circuit, wherein the main operational amplifier is configured to: perform operational amplification based on a reference signal and a feedback signal of an output voltage of the switching circuit, to obtain an operational amplification signal for controlling a switching state of the switching circuit; and include a compensation circuit, which is configured to generate an adjustment signal according to the feedback signal, the reference signal, and a preset first voltage; wherein when a load of the switching circuit is reduced, an output terminal of the main operational amplifier receives the adjustment signal and obtains an adjusted operational amplification signal, and the adjustment signal is used for suppressing a change of the operational amplification signal.

Optionally, the first voltage has a constant voltage value.

Optionally, the first voltage varies in positive correlation with the output voltage of the switching circuit.

Optionally, the compensation circuit further comprises an auxiliary operational amplifier, which is configured to obtain the adjustment signal by performing operational amplification on a signal obtained by subtracting the first voltage from a difference between the feedback signal and the reference signal.

Optionally, the auxiliary operational amplifier is configured to adaptively cut off an output of the auxiliary operational amplifier when the difference between the feedback signal and the reference signal is lower than the first voltage.

Optionally, each of the main operational amplifier and the auxiliary operational amplifier is a transconductance amplifier, an output terminal of the auxiliary operational amplifier is connected with the output terminal of the main operational amplifier through an unidirectional conduction device, a positive electrode of the unidirectional conduction device is connected with the output terminal of the auxiliary operational amplifier, and a negative electrode of the unidirectional conduction device is connected with the output terminal of the main operational amplifier; the output terminal of the main operational amplifier is connected with a first capacitor, and a voltage on the first capacitor serves as the operational amplification signal.

Optionally, a non-inverting input terminal of the auxiliary operational amplifier receives a difference between the feedback signal and the first voltage, an inverting input terminal of the auxiliary operational amplifier receives the reference signal, and the auxiliary operational amplifier outputs the adjustment signal.

Optionally, a non-inverting input terminal of the auxiliary operational amplifier receives the feedback signal, an inverting input terminal of the auxiliary operational amplifier receives a sum of the reference signal and the first voltage, and the auxiliary operational amplifier outputs the adjustment signal.

Optionally, operational amplification gains of the main operational amplifier and the auxiliary operational amplifier are equal.

The present disclosure further provides a switching circuit, comprising a power transistor and a controller, the controller is configured to control a switching state of the power transistor, and the controller comprises an operational amplifier circuit according to any one of the embodiments of the present disclosure. The operational amplifier circuit is configured to obtain an operational amplification signal by performing operational amplification based on the reference signal and the feedback signal, and adjust the operational amplification signal when the load is reduced, so as to suppress a change of the operational amplification signal.

Compared with the prior art, the technical proposals according to the present disclosure has following advantages: in an application of the switching circuit, according to embodiments of the present disclosure, without detecting a change of the load of the switching circuit, an output signal of the operational amplifier circuit can be self-adaptively adjusted when the load is reduced, so as to inhibit, reduce or weaken the change of the output signal of the operational amplifier circuit, so that the output signal of the operational amplifier circuit can be quickly restored to stability in a short time, thus the switching circuit can perform dynamic response timely when the switching circuit is loaded next time; in particular, the switching circuit according to embodiments of the present disclosure has better output performance in applications where frequent unloading and loading occur.

BRIEF DESCRIPTION OF THE DRAWINGS

The above and other objects, features and advantages of the present invention will become more apparent from the description below with reference to the accompanying drawings.

DETAILED DESCRIPTION OF EMBODIMENTS OF THE DISCLOSURE

Preferred embodiments of the present invention are described in detail below in conjunction with the accompanying drawings, however, the present invention is not limited to these embodiments. The present invention covers any substitutions, modifications, equivalent methods, and schemes made within the spirit and scope of the present disclosure.

In order to enable the public to have a thorough understanding of the present disclosure, specific details are described in detail in the following preferred embodiments of the present disclosure, however, the present disclosure may also be fully understood by those skilled in the art without those specific details.

The present invention is described with examples in more detail in the following paragraphs with reference to the accompanying drawings. It should be noted that the drawings are all in a simplified form and may use imprecise proportions, and are only used to assist in explaining an objective of the embodiments of the present disclosure conveniently and clearly.

Figure 1:
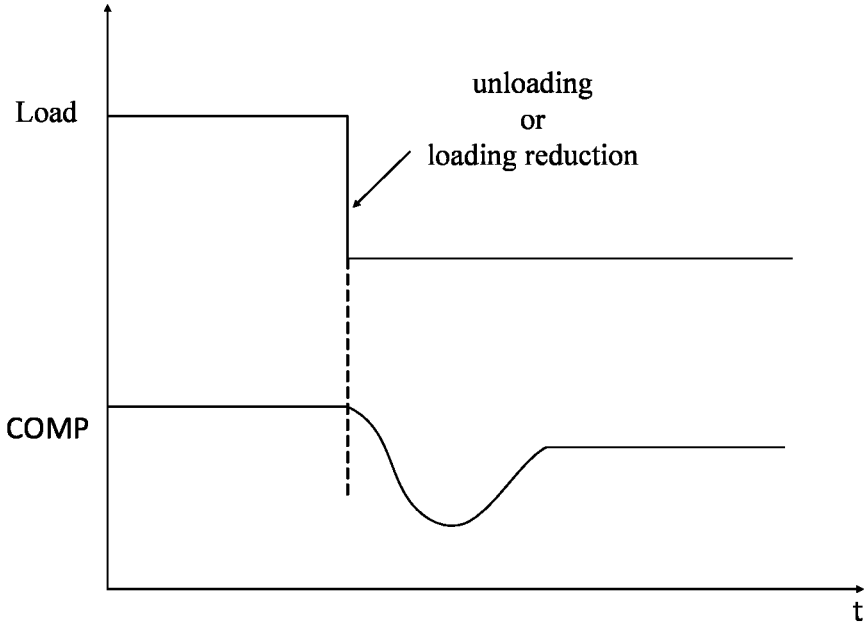
FIG. 1 is an output waveform diagram of an operational amplifier when a load of a switching circuit is reduced according to the prior art.
Figure 2:
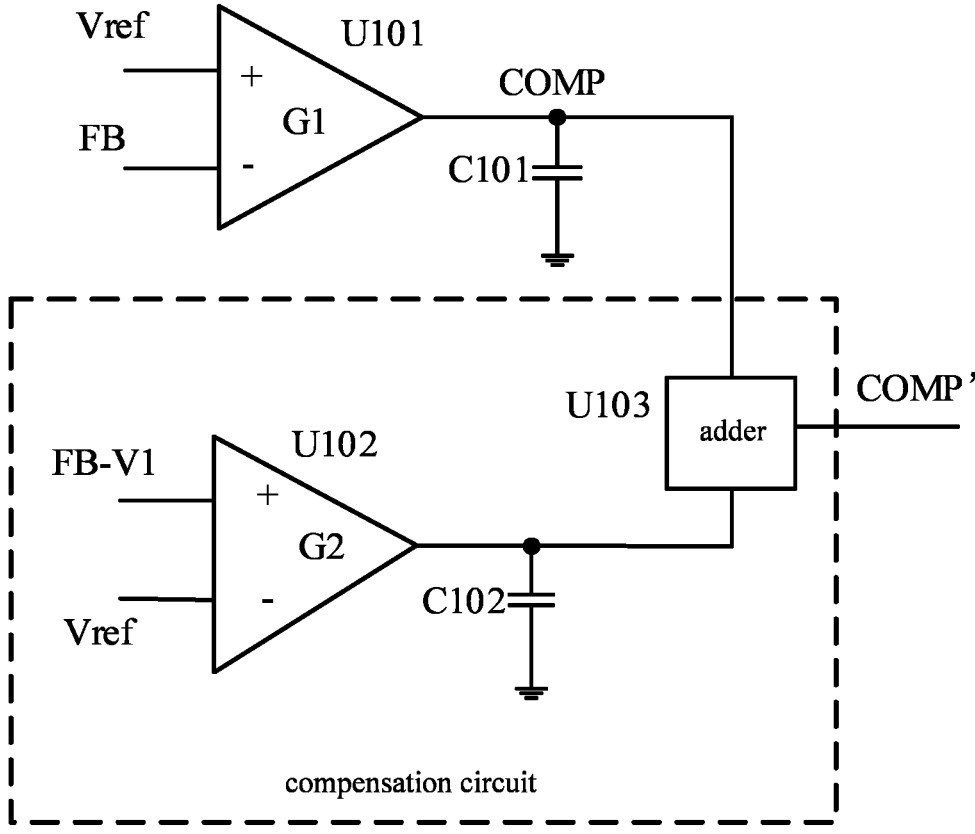
FIG. 2 is a schematic diagram of an operational amplifier circuit according to an embodiment of the present disclosure.

As shown in FIG. 2, a schematic diagram of an operational amplifier circuit according to an embodiment of the present disclosure is illustrated. The operational amplifier circuit comprises a main operational amplifier U101, which performs operational amplification on a difference between a reference signal Vref and a feedback signal FB of an output voltage of the switching circuit to obtain an operational amplification signal COMP; in the switching circuit, when a load of the switching circuit is reduced, an output signal of the main operational amplifier U101 is adaptively adjusted, so that an adjusted operational amplification signal COMP' can be obtained. Preferably, the operational amplifier circuit is configured to obtain the adjusted operational amplification signal COMP' by superimposing the output signal of the main operational amplifier with an adjustment signal which is generated by the operational amplifier circuit, and the adjustment signal is used to suppress a change of the operational amplification signal; preferably, the adjustment signal is obtained according to the feedback signal, the reference signal and a first voltage, and preferably, the first voltage may be set to have a constant voltage value or vary in positive correlation with the output voltage.

The operational amplifier circuit in the embodiment of the present disclosure may further include a compensation circuit comprising an auxiliary operational amplifier U102 and an adder U103, wherein the auxiliary operational amplifier U102 is configured to obtain the adjustment signal by performing operational amplification on a signal obtained by subtracting the first voltage V1 from the difference between the feedback signal FB and the reference signal Vref, the adjustment signal is added with the output signal of the main operational amplifier U101 by use of the adder U103, a part of the output signal of the main operational amplifier U101 is cancelled by the auxiliary operational amplifier U102, and another part of the output signal of the main operational amplifier U101 is equivalent to an output obtained by amplifying the first voltage V1, so that the adjusted operational amplification signal can be obtained. The first voltage V1 may be set to have a constant voltage value or vary in positive correlation with the output voltage, and the first voltage V1 may be preferably set to k*Vo. The auxiliary operational amplifier U102 is configured to adaptively cut off its output when an input difference (FB−Vref−V1) is negative, which represents that a deviation of the output voltage from an expected output voltage is lower than a first threshold, and the adjustment signal is not added to the output signal of the main operational amplifier.

Figure 3:
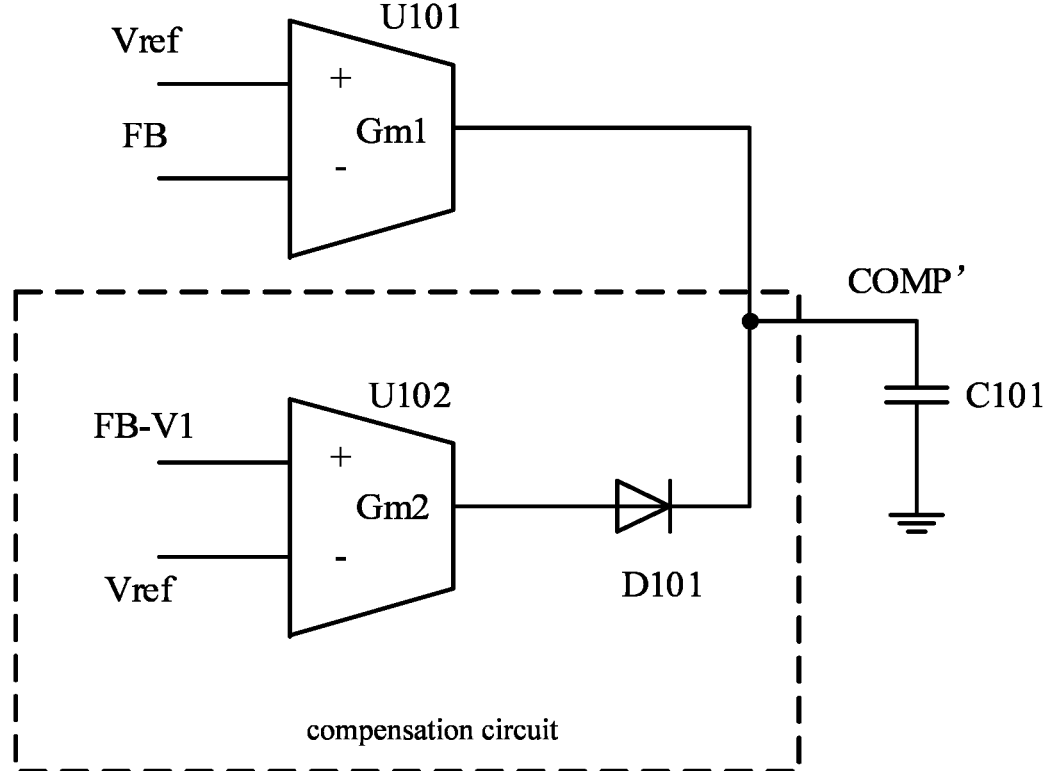
FIG. 3 is a schematic diagram of an operational amplifier circuit according to another embodiment of the present disclosure.

As shown in FIG. 3, a schematic diagram of an operational amplifier circuit according to a second embodiment of the present disclosure is illustrated, and is an optimal conversion made on the basis of a principle according to the embodiment shown FIG. 2. Each of the main operational amplifier and the auxiliary operational amplifier may be a transconductance amplifier, the main operational amplifier U101 is configured to perform amplification on an error between the reference signal Vref and the feedback signal FB, and then perform voltage-to-current conversion to output a current signal, an output terminal of the main operational amplifier is connected with a capacitor C101, the auxiliary operational amplifier U102 is configured to output a current signal by performing operation and conversion on a voltage (FB−Vref−V1), which is obtained by subtracting the first voltage V1 from the difference between the feedback signal FB and the reference signal Vref, a positive electrode of the unidirectional conduction device is connected with an output terminal of the auxiliary operational amplifier, and a negative electrode of the unidirectional conduction device is connected with the output terminal of the main operational amplifier, and preferably, the unidirectional conduction device may be implemented by a diode D101. Optionally, as shown in FIGS. 2 and 3, a non-inverting input terminal of the auxiliary operational amplifier U102 receives a difference between the feedback signal FB and the first voltage V1, an inverting input terminal of the auxiliary operational amplifier U102 receives the reference signal Vref, and an output terminal of the auxiliary operational amplifier U102 outputs the adjustment signal; optionally, the non-inverting input terminal of the auxiliary operational amplifier U102 receives the feedback signal FB, the inverting input terminal of the auxiliary operational amplifier U102 receives a sum of the reference signal and the first voltage V1, and the output terminal of the auxiliary operational amplifier U102 outputs the adjustment signal. It can be understood that, as long as the difference between an input signal received by the non-inverting input terminal and an input signal received by the inverting input terminal of the auxiliary operational amplifier U102 satisfies an expression: FB−Vref−V1, corresponding technical proposals can be covered by the protection range of the present invention.

When the load decreases, the feedback signal FB suddenly increases, the difference between the reference signal Vref and the feedback signal FB becomes negative, a reverse current output by the main operational amplifier U101 flows into the output terminal of the main operational amplifier U101, the voltage obtained by subtracting the first voltage V1 from the difference between the feedback signal FB and the reference signal Vref becomes positive, a positive current output by the auxiliary operational amplifier U102 flows into the main operational amplifier, the current output by the auxiliary operational amplifier U102 is lower than the input current of the main operational amplifier U101, and the capacitor C101 is also discharged to the main operational amplifier, so that the voltage on the capacitor C101 decreases; when the deviation between the output voltage of the switching circuit and the expected output voltage is lower than the first threshold value, the feedback signal FB is close to the reference signal Vref, a difference value between the input signals of the auxiliary operational amplifier U102 is negative, the output terminal of the auxiliary operational amplifier U102 needs an inflow current, and because the output terminal of the auxiliary operational amplifier U102 is connected with the unidirectional conduction device (which is preferably implemented by a diode D101), the current inflow to the output terminal of the auxiliary operational amplifier U102 is cut off, that is, the output of the auxiliary operational amplifier U102 is cut off. At this time, the voltage on the capacitor C101 is stable, and the stabilized voltage on the capacitor C101 can serve as the adjusted operational amplification signal.

The operational amplifier circuit according to the embodiment of the present disclosure comprises a common operational amplifier as shown in FIG. 2 or a transconductance amplifier as shown in FIG. 3 or an error amplifier of other type. Gain (e.g., G1 as shown in FIG. 2 or Gm1 as shown in FIG. 3) of the main operational amplifier and gain (e.g., G2 as shown in FIG. 2 or Gm2 as shown in FIG. 3) of the auxiliary operational amplifier according to the embodiment of the present disclosure may be equal or unequal, or the gains of the two operational amplifiers may be proportional to each other. In a preferred embodiment, the gains of the main operational amplifier and the auxiliary operational amplifier are equal.

Figure 4:
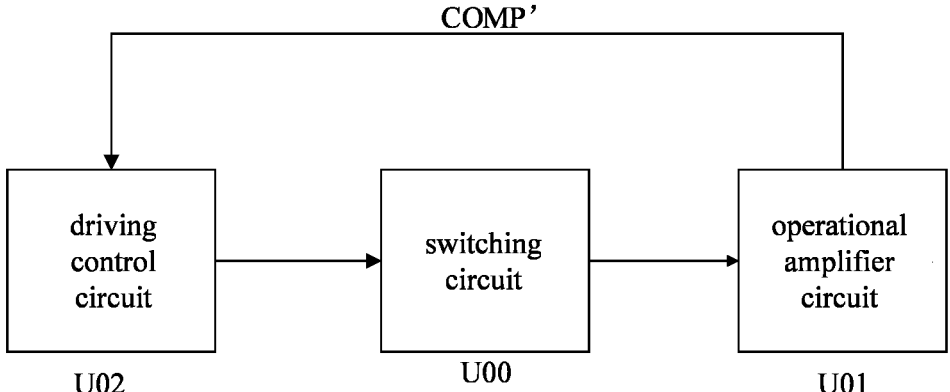
FIG. 4 is a schematic diagram of a switching circuit according to an embodiment of the present disclosure.

As shown in FIG. 4, a schematic diagram of the switching circuit according to an embodiment of the present disclosure is illustrated. The operational amplifier circuit (e.g., U01 as shown in FIG. 4) according to the embodiment of the present disclosure can be used for switching circuit control, wherein the main operational amplifier performs operational amplification based on the reference signal and the feedback signal of the output voltage of the switching circuit (e.g., U00 as shown in FIG. 4) to obtain an operational amplification signal, and when the load of the switching circuit is reduced, the operational amplification signal can be adaptively adjusted to suppress changes; the adjusted operational amplification signal (e.g., COMP' as shown in FIG. 4) can be used to control the switching state (e.g., on state and off state) of the switching circuit through a driving control circuit (e.g., U02 as shown in FIG. 4).

Figure 5:
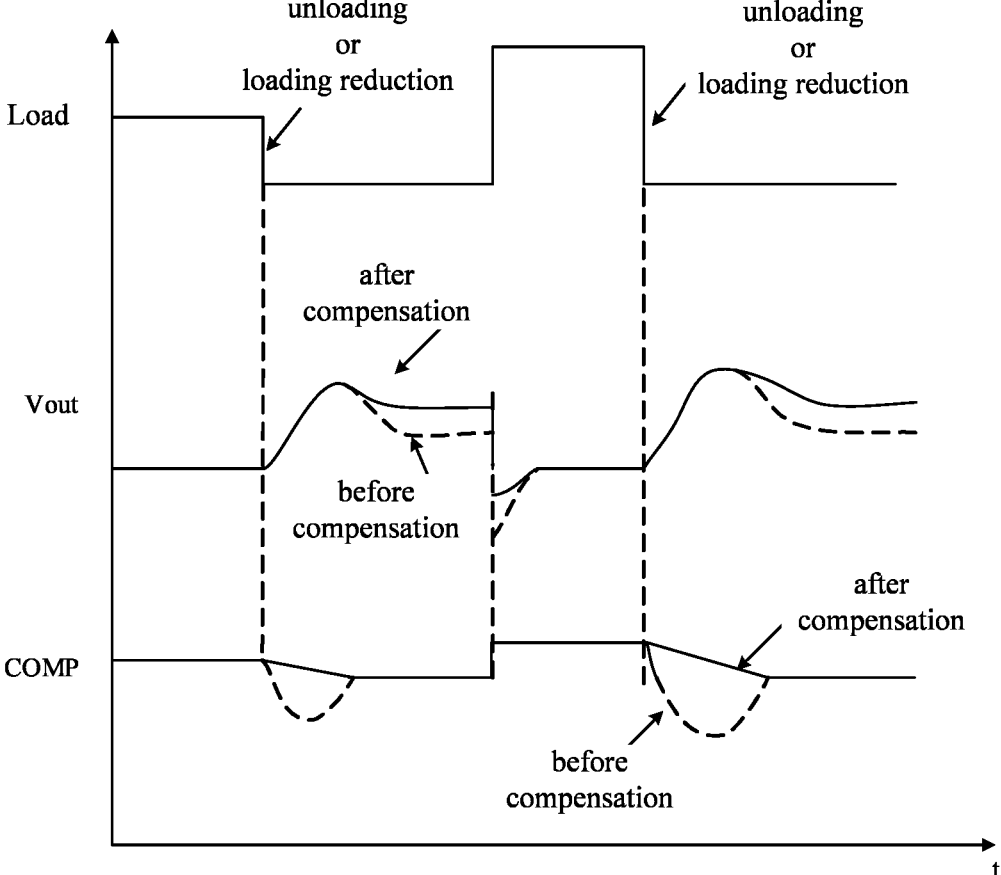
FIG. 5 is a waveform diagram of an operational amplification signal according to an embodiment of the present disclosure.

As shown in FIG. 5, a waveform schematic diagram of the operational amplification signal according to an embodiment of the present disclosure is illustrated. Taking an example that an adjustment is performed on the reference signal Vref, if the operational amplifier is not adjusted (before compensation) in a load reduction event, corresponding waveforms of related signals are shown by dashed lines in the figure, the output voltage Vout and the feedback signal FB (not shown) may rapidly increase and then drop to a stable value, and the operational amplification signal COMP rapidly drops and then keeps rising in a period of time and then restores to stability; if the output of the operational amplifier is adjusted (after compensation) in a load reduction event, an amplitude drop of the output voltage Vout can be reduced, as can be seen from the figure, an amplitude change of the operational amplification signal COMP can be greatly reduced and the operational amplification signal COMP can be more smoothly restored to a stable voltage, so that the switching circuit can better respond to a load change when the switching circuit is loaded next time, especially in switching circuit applications with frequent load changes, thus preventing response ability to a next loading from being affected by load reduction, realizing better output characteristics.

The load mentioned in the present disclosure may include resistive load, capacitive load, inductive load, resistive-inductive load, motor, LED and/or the like, and is not limited to a certain type of load or a certain kind of load; taking resistive load as an example, a value of the load in the present disclosure refers to load resistance, load current magnitude, or consumed electric energy; a broad definition of load in power electronic systems is applicable to the present invention.

In addition, although the embodiments are described and explained separately above, some common technique may be substituted and integrated among the embodiments in the view of those of ordinary skill in the art, and reference may be made to another described embodiment for contents which are not explicitly described in one of the embodiments.

The above-mentioned implementations are not meant to limit the protection scope of the technical proposals according to the present disclosure. Any modification, equivalent replacement and improvement made within the spirits and principles of the above embodiments shall be included in the protection scope of the technical proposals according to the present disclosure.

The invention claimed is:

1. An operational amplifier circuit, comprising a main operational amplifier used in a switching circuit, wherein the main operational amplifier is configured to:

perform operational amplification based on a reference signal and a feedback signal of an output voltage of the switching circuit, to obtain an operational amplification signal for controlling a switching state of the switching circuit; and include a compensation circuit, which is configured to generate an adjustment signal according to the feedback signal, the reference signal, and a preset first voltage;

wherein when a load of the switching circuit is reduced, an output terminal of the main operational amplifier receives the adjustment signal and obtains an adjusted operational amplification signal, and the adjustment signal is used for suppressing a change of the operational amplification signal.

2. The operational amplifier circuit according to claim 1, wherein the first voltage has a constant voltage value.

3. The operational amplifier circuit according to claim 1, wherein the first voltage varies in positive correlation with the output voltage of the switching circuit.

4. The operational amplifier circuit according to claim 1, wherein the compensation circuit further comprises an auxiliary operational amplifier, which is configured to obtain the adjustment signal by performing operational amplification on a signal obtained by subtracting the first voltage from a difference between the feedback signal and the reference signal.

5. The operational amplifier circuit according to claim 4, wherein the auxiliary operational amplifier is configured to adaptively cut off an output of the auxiliary operational amplifier when the difference between the feedback signal and the reference signal is lower than the first voltage.

6. The operational amplifier circuit according to claim 4, wherein each of the main operational amplifier and the auxiliary operational amplifier is a transconductance amplifier, an output terminal of the auxiliary operational amplifier is connected with the output terminal of the main operational amplifier through an unidirectional conduction device, a positive electrode of the unidirectional conduction device is connected with the output terminal of the auxiliary operational amplifier, and a negative electrode of the unidirectional conduction device is connected with the output terminal of the main operational amplifier; the output terminal of the main operational amplifier is connected with a first capacitor, and a voltage on the first capacitor serves as the operational amplification signal.

7. The operational amplifier circuit according to claim 4, wherein a non-inverting input terminal of the auxiliary operational amplifier receives a difference between the feedback signal and the first voltage, an inverting input terminal of the auxiliary operational amplifier receives the reference signal, and the auxiliary operational amplifier outputs the adjustment signal.

8. The operational amplifier circuit according to claim 4, wherein a non-inverting input terminal of the auxiliary operational amplifier receives the feedback signal, an inverting input terminal of the auxiliary operational amplifier receives a sum of the reference signal and the first voltage, and the auxiliary operational amplifier outputs the adjustment signal.

9. The operational amplifier circuit according to claim 4, wherein an operational amplification gain of the main operational amplifier and an operational amplification gain of the auxiliary operational amplifier are equal.

10. A switching circuit, comprising a power transistor and a controller, wherein the controller is configured to control a switching state of the power transistor, and comprises the operational amplifier circuit according to claim 1, wherein the operational amplifier circuit is configured to obtain the operational amplification signal by performing operational amplification based on the reference signal and the feedback signal, and adjust the operational amplification signal when the load is reduced, so as to suppress a change of the operational amplification signal.

11. The switching circuit according to claim 10, wherein the first voltage has a constant voltage value.

12. The switching circuit according to claim 10, wherein the first voltage varies in positive correlation with the output voltage of the switching circuit.

13. The switching circuit according to claim 10, wherein the compensation circuit further comprises an auxiliary operational amplifier, which is configured to obtain the adjustment signal by performing operational amplification on a signal obtained by subtracting the first voltage from a difference between the feedback signal and the reference signal.

14. The switching circuit according to claim 13, wherein the auxiliary operational amplifier is configured to adaptively cut off an output of the auxiliary operational amplifier when the difference between the feedback signal and the reference signal is lower than the first voltage.

15. The switching circuit according to claim 13, wherein each of the main operational amplifier and the auxiliary operational amplifier is a transconductance amplifier, an output terminal of the auxiliary operational amplifier is connected with the output terminal of the main operational amplifier through an unidirectional conduction device, a positive electrode of the unidirectional conduction device is connected with the output terminal of the auxiliary operational amplifier, and a negative electrode of the unidirectional conduction device is connected with the output terminal of the main operational amplifier; the output terminal of the main operational amplifier is connected with a first capacitor, and a voltage on the first capacitor serves as the operational amplification signal.

16. The switching circuit according to claim 13, wherein a non-inverting input terminal of the auxiliary operational amplifier receives a difference between the feedback signal and the first voltage, an inverting input terminal of the auxiliary operational amplifier receives the reference signal, and the auxiliary operational amplifier outputs the adjustment signal.

17. The switching circuit according to claim 13, wherein a non-inverting input terminal of the auxiliary operational amplifier receives the feedback signal, an inverting input terminal of the auxiliary operational amplifier receives a sum of the reference signal and the first voltage, and the auxiliary operational amplifier outputs the adjustment signal.

18. The switching circuit according to claim 13, wherein an operational amplification gain of the main operational amplifier and an operational amplification gain of the auxiliary operational amplifier are equal.

\* \* \* \* \*